United States Patent [19]

Watariguchi

[11] 4,271,258
[45] Jun. 2, 1981

[54] PHOTOPOLYMERIZABLE INK COMPOSITIONS

[75] Inventor: Kiyosumi Watariguchi, Iruma, Japan

[73] Assignee: Tamura Kaken Co., Ltd., Iruma, Japan

[21] Appl. No.: 171,053

[22] Filed: Jul. 22, 1980

[30] Foreign Application Priority Data

Jun. 11, 1980 [JP] Japan ................................ 55-77686

[51] Int. Cl.³ .............................................. G03C 1/68
[52] U.S. Cl. ................................... 430/284; 430/285; 430/286; 430/288; 204/159.15; 204/159.19; 106/20
[58] Field of Search ............... 430/285, 286, 288, 284, 430/281; 204/159.15, 159.19; 106/20; 427/54.1

[56] References Cited

U.S. PATENT DOCUMENTS

| 3,772,061 | 11/1973 | Shur et al. .......................... 430/270 |
| 3,883,352 | 5/1975 | Kloczewski et al. ................ 430/286 |
| 4,003,877 | 1/1977 | Lipson et al. ........................ 430/281 |
| 4,014,771 | 3/1977 | Rosenkranz et al. ................ 430/285 |
| 4,018,940 | 4/1977 | Morgan ............................... 430/286 |
| 4,072,770 | 2/1978 | Ting et al. ........................... 430/923 |
| 4,168,173 | 9/1979 | Pohl .................................... 430/286 |
| 4,169,732 | 10/1979 | Shipley ................................ 430/280 |

Primary Examiner—Jack P. Brammer
Attorney, Agent, or Firm—Blanchard, Flynn, Thiel, Boutell & Tanis

[57] ABSTRACT

A photopolymerizable ink composition containing as essential ingredients (A) a high molecular diacrylate of epoxy resin made of bisphenol A and epichlorohydrin, (B) a urethane modified acrylate resin, (C) a urethane bond-free bifunctional photopolymerizable methacrylate monomer or oligomer, (D) a urethane bond-free polyfunctional photopolymerizable acrylate monomer or oligomer and (E) a photo-initiator, is curable upon short time exposure to ultra-violet irradiation and possesses the electrical, mechanical and chemical properties indispensable to a protective film for use in printed circuit boards.

7 Claims, No Drawings

PHOTOPOLYMERIZABLE INK COMPOSITIONS

BACKGROUND OF THE INVENTION (a) Field of the Invention

This invention relates to a photopolymerizable screen printing ink composition which is very useful especially as a permanent protective film for use in printed circuit boards, in particular to a non-volatile ink composition which, even in a thick film state, is curable upon short time exposure to ultra-violet irradiation thereby to form a film which possesses, in abundance, various characteristics such as electric insulation, heat resistance, hardness, flexibility, adhesion and solvent resistance.

(b) Description of the Prior Art

In recent years, much active study has been made, in many quarters, of photosensitive compositions as a means for achieving matters of social concern, such as absence of environmental pollution, economy of natural resources and energy economy and the produced photosensitive compositions have been put to practical use. Some of them have been applied to solder-masking inks for use in printed circuit boards, electric insulating inks, acid resisting inks, etc., and they are commercially available as ultra-violet curable type inks. The material for the formation of an ultra-violet curable type protective film for use in printed circuit boards is required to possess a number of practical characteristics. For instance, the solder mask formed selectively on a tin-lead plated circuit board made of epoxy-fiberglass composite is required to be characterized such by features that: it can attain a thickness sufficient to fully cover the circuit by the aid of screen printing and, even in a thick-film state; it is curable upon exposure to a short time ultra-violet irradiation; it has a film hardness suitable for masking purposes; it possesses heat resistance, flexibility and adhesion sufficient that the film can follow the fluidity of solder melted again at the time of soldering, thereby maintaining adhesion and the appearance of the film after soldering; and it possesses solvent resistance at the time of washing the flux residue, oil and so forth, and it possesses electric insulation and moisture-resistance required for the protective film and the like.

However, the fact is that it is difficult to obtain a composition capable of exhibiting the electrical, mechanical, thermal and chemical properties essential to the permanent protective film for use in printed circuit boards owing to the general defects resulting from the unevenness of the curing and the stress of the film that has been cured rapidly mainly by a light energy-utilizing radical reaction and in view of the circumstances where photosensitive compositions have hitherto been developed with the intention of being utilized as image forming materials, typically, for relief plates and intaglio plates and the like, as well as ornamental materials for wood, paper, plastic and the like.

Although various photosensitive compositions are well-known, only a small number have taken account the mechanical, chemical, physical and electric properties to such an extent as to make them applicable as a permanent protective film for use in printed circuit boards, and to meet the conditions for safety, sanitation and curability. Epoxy acrylate is utilized for various kinds of ink vehicles because it possesses superior characteristics such as photosensitivity, hardness, solvent resistance and heat resistance. U.S. Pat. Nos. 3,772,062 and 4,014,771 disclose that improvements in curing speed, hardness, solvent resistance and so forth are achieved by the combination of a relatively low molecular epoxy acrylate with a monofunctional monomer or polyfunctional monomer, but not in the properties required for protective film materials for use in printed circuit boards, such as electric insulation, resistance, adhesion and so forth. Generally speaking, epoxy acrylate is defective in that it is inferior in respect of the properties such as flexibility and adhesion, and accordingly ingenuity should be exerted in overcoming this defect. It is well known that compounding of said monofunctional monomer in a large quantity is not preferable from the viewpoint of safety and sanitation, and it is apt to deteriorate the physical property of the coated film generally, with the exception of specific uses. U.S. Pat. No. 4,003,877 proposes a composition capable of functioning as protective film materials for use in printed circuit boards without utilizing a monofunctional monomer. However, said patent is silent as to improving the aforesaid defects inherent in the epoxy acrylate. It involves many difficulties to attain flexibility by the individual use of an epoxy acrylate-polyfunctional monomer system. U.S. Pat. No. 4,169,732 discloses the attainment of flexibility and coated film strength by the concurrent use of relatively high molecular weight bisphenol A type and novolak type epoxy acrylates, but said patent is different from the instant invention in view of employing the post-curing and organic solvent.

A urethane modified acrylate, generally speaking, is superior in the properties of flexibility and adhesion, but is inferior in heat resistance, chemical resistance, moisture resistance, hardness and ultra-violet curability as compared with said epoxy acrylate. Prior inventions are mostly directed toward improvements in this defect. For instance, U.S. Pat. No. 4,072,770 is concerned with improvements in the mechanical properties of polyester urethane acrylate. However, this advantage is not developed to such an extent as to make it applicable to printed circuit boards. Further, it is difficult to attain a sufficient usability as the permanent protective film for use in printed circuit boards by the individual use of said urethane modified acrylate. In U.S. Pat. Nos. 3,883,352 and 4,018,940 there are disclosed polyene-polythiol compositions which are relatively superior in coated film flexibility as well as superior in heat resistance and adhesion. However, polythiol type vehicles in general are defective in that they emit a strong foul odor.

SUMMARY OF THE INVENTION

It is an object of the instant invention to provide a photopolymerizable screen printing ink composition which is very useful especially as the permanent protective film for use in printed circuit boards, in particular to provide a non-volatile ink composition which, even in a thick film state, is curable upon exposure to a short time ultra-violet irradiation thereby to form a film possessing, in abundance, various characteristics such as electric insulation, heat resistance, hardness, flexibility, adhesion and solvent resistance. This improved composition having the practical characteristics essential to the permanent protective film for use in printed circuit boards in a well-balanced manner basically includes following essential ingredients;

A. a diacrylate of epoxy resin made of bisphenol A and epichlorohydrin, whose average molecular weight is in the range of from about 1,000 to 4,000 (which may be called epoxy acrylate hereinafter), B. a photosensitive resin having an average molecular weight in the range of from about 1,000 to 10,000, which has two or more acryloyl groups at the terminal through urethane bonds (which may be called a urethane modified acrylate resin hereinafter), C. a urethane bond-free bifunctional photopolymerizable methacrylate monomer or oligomer, D. a urethane bond-free polyfunctional photopolymerizable acrylate monomer or oligomer, and E. a photo-initiator, where the weight ratios between the respective ingredients A, B, C, D and E are in the following ranges:

A:B=95:5–10:90

C:D=95:5–10:90

(A+B):(C+D)=15:85–70:30 wherein E is present in the entire ink composition in a weight percentage ranging from 0.3 to 8.

The object of the instant invention is achieved by the aid of synergy between the above enumerated ingredients.

DETAILED DESCRIPTION OF THE INVENTION

I have exerted my ingenuity with a view to reducing the differences in performance caused by the advantages and defects inherent in the various kinds of photosensitive polymers, oligomers and monomers, which led to obtaining the aforesaid vehicle as the essential ingredient for the photopolymerizable ink composition. This will be detailed hereinafter.

The epoxy acrylate denoted as ingredient A contributes to promoting the properties such as curing speed, hardness, heat resistance, solvent resistance and electric insulation. This can be obtained by a well-known process comprising reacting a bisphenol A-diglycidyl ether type epoxy resin, prepared by the condensation reaction between bisphenol A and epichlorohydrin, as a prepolymer, with acrylic acid, by means of a thermopolymerization inhibitor such as hydroquinone, hydroquinone monomethyl ether or the like, and a catalyst such as tertiary amine, quarternary ammonium salt or the like. This resin is represented by the following general formula and a commercially available one may also be used.

epoxy resin, there can be enumerated methacrylic acid. But, it is too slowly cured to be put to practical use.

The urethane modified acrylate resin denoted as ingredient B contributes to promoting the properties such as flexibility and adhesion and it is capable of providing superior mechanical properties by the aid of synergy with the epoxy acrylate used in the instant invention. The addition of a non-photosensitive or extremely poorly photosensitive high molecular polymer or monomer, as a plasticizer, in order to obtain flexibility brings about a deterioration of heat resistance, solvent resistance and electric insulation, which is a different measure not involved in the instant invention. In the instant invention, in contrast, there is used a urethane modified acrylate resin which possesses a comparatively superior photosensitivity in addition to its own flexibility. This urethane modified acrylate resin is a reaction product between a polyol prepolymer, an organic diisocyanate and a hydroxyl group—containing lower alkyl acrylate, and it can be obtained by a well-known process. A commercially available one may be utilized for that purpose. However, it is necessary that the urethane modified acrylate should have two or more acryloyl groups, namely photosensitive groups, which exist in the terminal through urethane bonds, and further should have an average molecular weight ranging from about 1,000 to 10,000. In this connection, it is to be noted that in case where the molecular weight is less than about 1,000, the urethane modified acrylate is inferior in flexibility which should be said a merit inherent therein, and in case where the molecular weight is more than about 10,000, it is inferior in photosensitivity. The introduction of photosensitive groups other than the acryloyl group into a urethane modified prepolymer acts to lower its photosensitive property and therefore does not meet the practical purposes. As polyol prepolymers suitably used in the instant invention, there can be enumerated a polyester polyol having an average molecular weight of about 500 or more and an acid number of 20 or less, preferably less than 10, a polyether polyol having an average molecular weight of about 1,000 or more, a polybutadiene having an average molecular weight of about 1,000 or more and further hydroxyl groups at the terminal, and a polybutadiene acrylonitrile having an average molecular weight of about 1,000 or more and further hydroxyl groups at the terminal. The reason why the molecular weight and acid

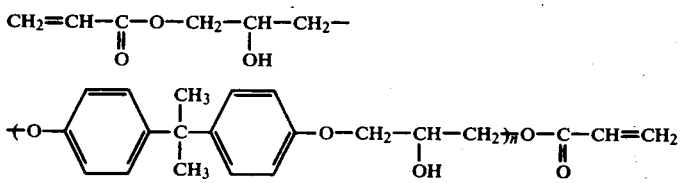

In this connection, it is to be understood that the epoxy acrylate suitably used in the instant invention has an average molecular weight ranging from about 1,000 to 4,000. This constitutes one of the features of the instant invention. In case where a low molecular weight prepolymer is employed, it deteriorates the flexibility of the resulting film and displays a large curing stress against other ingredients, whereby the good results intended by the instant invention can not be attained to the fullest extent. An another unsaturated monobasic acid for introducing a photosensitive group into an number of the prepolymer are regulated as above consists in that when said values deviate from the above defined range not only the flexibility of the prepolymer but also the chemical resistance of the final composition are deteriorated. The organic diisocyanates suitably used in the instant invention include, in addition to typical tolylenediisocyanate, xylylenediisocyanate, 4,4'-diphenylmethanediisocyanate, isophoronediisocyanate and hexamethylenediisocyanate. In this connection, it is to be understood that it is preferable, for obtaining heat resistance, to select diisocyanates which have a benzene nucleus in the molecule of the urethane modified acrylate. The hydroxyl group-containing lower alkyl acrylates suitably used in the instant invention include 2-hydroxyethylacrylate and 2-hydroxypropylacrylate.

The aforesaid epoxy acrylate and urethane modified acrylate, as they are, can not be employed for ink vehicle purposes because they basically have a solid or viscous liquid form. Therefore, an ingredient for diluting them is required. The instant invention does not employ low boiling organic solvents such as methyl ethyl ketone (MEK), methyl cellosolve, etc., and volatile monomers such as styrene, etc., taking into consideration the environmental pollution to be caused thereby and their virulence. The photopolymerizable monomer and oligomer not only act as a diluent, but also substantially perticipate in the formation of a curable film, thereby having a great influence upon the physical properties thereof. The other feature of the instant invention consists in having exerted the same ingenuity and study in the photopolymerizable monomer and oligomer as applied in ingredients A and B also from the viewpoint of film forming material in addition to safety and sanitation. It is very important to include, as essential ingredients, a urethane bond-free bifunctional photopolymerizable methacrylate monomer or oligomer and a urethane bond-free polyfunctional photopolymerizable acrylate monomer or oligomer, respectively, so that the results intended by the instant invention may be achieved by synergy of them with ingredients A and B. Although many instances are perceived where a monofunctional monomer has been compounded in a large quantity, said monomer is not preferable because it leads to a deterioration of electric insulation, heat-resistance and mechanical properties of the film and further its boiling point is lower than that of the polyfunctional monomer.

The urethane bond-free bifunctional photopolymerizable methacrylates denoted as ingredient C suitable used in the instant invention include ethylene glycol dimethacrylate, diethylene glycol dimethacrylate, triethylene glycol dimethacrylate, tetraethylene glycol dimethacrylate, polyethylene glycol #200 dimethacrylate, propylene glycol dimethacrylate, dipropylene glycol dimethacrylate, 1,3-butylene glycol dimethacrylate, 1,6-hexane glycol dimethacrylate and neopentyl glycol dimethacrylate. In addition thereto, the dimethacrylate of a polyester oligomer having a viscosity of about 400 cps/25° C. or less and an acid number of 30 or less may be utilized. This is prepared in accordance with the condensation telomerization process taught by A. A. Berlin et al. in the Soviet Union, having the formula,

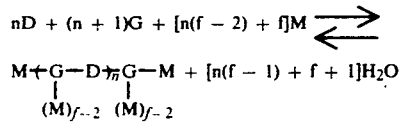

wherein D is a dibasic acid, G is a polyhydric alcohol, f($\geq 2$) is the number of functional groups of a polyhydric alcohol, M is telogen (acrylic acid or methacrylic acid) and n is an average condensation degree of a product oligomer.

The acrylate or methacrylate of polyester oligomer having various kinds of physical properties are commercially available. Furthermore, the foresaid monomer or oligomer may be used as a mixture thereof as occasion demands.

The urethane bond-free polyfunctional photopolymerizable acrylates denoted as ingredient D suitably used in the instant invention include ethylene glycol diacrylate, diethylene glycol diacrylate, triethylene glycol diacrylate, tetraethylene glycol diacrylate, polyethylene glycol #200 diacrylate, polyethylene glycol #400 diacrylate, polyethylene glycol #600 diacrylate, propylene glycol diacrylate, dipropylene glycol diacrylate, 1,3-butylene glycol diacrylate, 1,6-hexane glycol diacrylate, neopentyl glycol diacrylate, trimethylolpropane triacrylate, pentaerythritol triacrylate, pentaerythritol tetraacrylate and the polyester oligomer polyacrylate, obtained in accordance with the aforesaid process or available commercially, having a viscosity of about 400 cps/25° C. or less and an acid number of 30 or less, or mixtures thereof.

The compounding ratio of aforesaid vehicle ingredients, although determined depending on the properties of material to be selected, is in the range of A:B=95-:5–10:90, preferably 90:10–20:80; C:D=95:5–10:90, preferably 90:10–30:70; and A+B:C+D=15:85–70:30, preferably 25:75–65:35, each in terms of weight ratio.

Ingredients A and D contribute mainly to the properties such as heat-resistance, solvent resistance, electric insulation, curing speed and hardness, but when they are added more than they are actually needed, they deteriorate the flexibility of the coated film. Ingredients B and C contribute mainly to the properties such as flexibility and adhesion, but when they are added more than they are actually needed, they deteriorate the electric insulation, heat-resistance and solvent resistance of the coated film. The addition of low molecular weight ingredients C and D in excessive quantities leads to deterioration of flexibility of the coated film. When the ingredients deviate from the above defined ranges, it is impossible to achieve the effects intended by the instant invention to the fullest extent.

The photo-initiators, ingredient E, suitably used in the instant invention include benzoin, benzoin methyl ether, benzoin ethyl ether, benzoin isobutyl ether, benzoin isopropyl ether, 2-methyl anthraquinone, 2-t-butylanthraquinone, 2-ethylanthraquinone, Michler's ketone, thioxanthone, benzyl, benzophenone, acetophenone, α-diethoxyacetophenone, 2,2-dimethoxy-2-phenyl-acetophenone, or mixtures thereof. This photoinitiators should be added to the ink composition in the range of from 0.3 to 8% by weight, preferably in the range of from 0.6 to 6% by weight.

In order to achieve abilities required especially for the screen printing ink, it is possible to add, besides the aforesaid five essential ingredients, fillers such as barium sulfate, talc, calcium carbonate, silica or the like, colored pigments, levelling agents, antifoaming agents and thermopolymerization inhibitors such as hydroquinone, hydroquinone monomethyl ether or the like. However, it is necessary that these additives should be limited to small quantities to the utmost because these ingredients are liable to impede the ultra-violet curing of the coated film. In this connection, it is to be understood that in case where the filler present in the entire ink composition in excess of 40% by weight the results intended by the instant invention can not be achieved. In other words, preferably the filler should be present in a quantity of less than 30% by weight.

Next, the effects of the instant invention shall be described with reference to the following examples. In this connection, it is to be noted that a tin-lead plated circuit board (epoxy-fiberglass composite) was employed as a test piece in each example so that the properties of the coated film such as heat-resistance, solvent resistance, hardness, adhesion and flexibility may be evaluated collectively. The electric insulating resistance of the coated film was evaluated by means of a comb type electrode board in accordance with IPC-SM-840 method 2.5.23, said comb type electrode board comprising forming a copper-foiled electrode on an epoxy-fiberglass composite. The terms "part" or "parts" in each example mean part or parts by weight.

EXAMPLE 1

To 950 parts (2 equivalents) of a commercially available epoxy resin (whose average molecular weight is about 900 and epoxy equivalent 475) made of bisphenol A and epichlorohydrin and 145 parts (2 equivalents) of acrylic acid were added 0.45 part of hydroquinone as polymerization inhibitor, 3.5 parts of 2,4,6-tris(dimethylaminomethyl)phenol as catalyst and 365 parts of ethylene glycol dimethacrylate. The resulting mixture was reacted at 120° C. for 5 hours to thereby obtain an epoxy acrylate having an average molecular weight of about 1044. Separately, 200 parts (2 equivalents) of a commercially available 1,2-polybutadiene diol having molecular weight 2000, 350 parts (4 equivalents) of tolylene diisocyanate and 230 parts (2 equivalents9 of 2-hydroxyethylacrylate were reacted at 80° C. for 3 hours to thereby obtain a urethane modified polybutadiene diacrylate. Then, 53 parts of said epoxy acrylate (containing said ethylene glycol dimethacrylate), 10 parts of said urethane modified polybutadiene diacrylate, 17 parts of ethylene glycol dimethacrylate, 20 parts of trimethylolpropane triacrylate, 5 parts of benzoin isobutyl ether as photo-initiator, 20 parts of talc, 2 parts of colloidal silica, 0.3 part of Phthalocyanine Green, as a color pigment, and 0.15 part of silicone oil, as an antifoaming agent, were mixed to obtain an ink composition. The resulting ink composition was coated selectively on the aforesaid tin-lead plated board by means of a 150 mesh screen, and thereafter the same was allowed to pass through a path of 10 cm under a high pressure mercury lamp with an intensity of 120 W/cm at the A conveyor speed of 5 m/minute and was thus subjected to ultraviolet ray irradiation. The coated film was about 30 μm thick. The resulting coated film was cured solidly and was not tacky. A commercially available cellophane tacky tape was pressed onto the coated film and was peeled off rapidly, but no separation of the film from the base material took place. The film coated on the epoxy-fiberglass board was observed to have a very excellent pencil hardness, namely, of 4H. Next, a rosin-base flux diluted with an alcoholic solvent was applied onto the coated film and the same was dipped in a solder heated to a temperature of 250±5° C. for 5 seconds to thereby melt the solder again. After the board had been cooled, the flux residue was washed off therefrom by the use of 1,1,1-trichloroethane. The coated film well followed the fluidity of solder, was freed from the phenomena of falling off, blister, crater and bloom and, even when rubbed with a finger nail, it was not rubbed off. The coated film thus remained on the board as a permanent protective film. Furthermore, the coated film cured under the same conditions displayed a high electric insulating resistance of $2.0 \times 10^{12} \Omega$ after having been left standing for 96 hours under the atmospheric conditions; temperature 50°±2° C., relative humidity 95%.

EXAMPLE 2

1,000 Parts (1 equivalent) of commercially available polyethylene adipate (average molecular weight 2000, acid number 2 or less) and 175 parts (2 equivalents) of tolylene diisocyanate were mixed with 2 parts of dibutyltin laurate and 1000 parts of toluene. The mixture was reacted in the atmosphere of $N_2$ gas at 70° C. and for 3 hours. Successively, 120 parts (1 equivalent) of 2-hydroxyethyl acrylate and 0.2 parts of hydroquinone were added to the same and the resulting mixture was reacted at 70° C. and for 3 hours. Thereafter, the toluene was removed therefrom at reduced pressure to obtain a polyesterurethane acrylate. 20 Parts of this polyesterurethane acrylate, 33 parts of the epoxy acrylate obtained in Example 1, 17 parts of ethylene glycol dimethacrylate, 30 parts of trimethylolpropane triacrylate, 5 parts of benzoin ethyl ether as photo-initiator, 15 parts of talc, 1.5 parts of colloidal silica, 0.2 part of Phthalocyanine Green, and 0.15 part of silicone oil were mixed to thereby obtain an ink composition. This composition was coated on the tin-lead plated board according to the same procedure as Example 1, and the same was subjected to ultraviolet irradiation. The coated film was about 28 μm thick. The resulting coated film was cured solidly and was not tacky. A commercially available cellophane tacky tape was pressed onto the coated film and was peeled off rapidly, but no separation of film from the base material took place. The pencil hardness of this coated film was 3H. The re-melting of the solder was carried out according to the same procedure as Example 1, wherein the coated film was observed to well follow the fluidity of said melted solder and it formed an excellent permanent protective film as seen in Example 1. The coated film, after having been damped left standing, displayed a high electric insulating resistance of $1.5 \times 10^{12} \Omega$.

EXAMPLE 3

To 1,000 parts (1 equivalent) of polypropylene glycol (average molecular weight about 2000) and 175 parts (2 equivalents) of tolylene diisocyanate was added 1 part of dibutyltin laurate. The resulting mixture was reacted at 70° C. for 3 hours. Successively, 120 parts (1 equivalent) of 2-hydroxyethyl acrylate and 0.4 part of hydroquinone were added thereto, and the same was reacted at 70° C. for 3 hours to obtain a polyether urethane acrylate. 7 Parts of this polyether urethane acrylate, 51 parts of the epoxy acrylate obtained in Example 1, 17 parts of ethylene glycol dimethacrylate, 25 parts of trimethylolpropane triacrylate, 2 parts of benzoin ethyl ether and 2 parts of 2-t-butyl anthraquinone as photoinitiators, 20 parts of talc, 1.5 parts of colloidal silica, 0.2 part of Phthalocyanine Green, and 0.15 part of silicone oil were mixed to thereby obtain an ink composition. This composition was subjected to the same test procedure as Example 1. The coated film was about 28 μm thick. The solidly cured coated film has a pencil hardness of 3H, and when subjected to the tape test, no separation of the film took place. And, when subjected to the solder heat resisting test, it was observed that the coated film well followed the fluidity of melted solder and formed an excellent permanent protective film as seen in Example 1. The coated film, after having been damped left standing, displayed a high electric insulating resistance of $1.7 \times 10^{12} \Omega$.

EXAMPLE 4

To 3,800 parts (2 equivalents) of a commercially available epoxy resin (whose average molecular weight is about 2900 and epoxy equivalent is about 1900) made of bisphenol A and epichlorohydrin and 145 parts (2 equivalents) of acrylic acid were added 1.6 parts of hydroquinone, 12 parts of 2,4,6-tris(dimethylaminomethyl)phenol and 2,124 parts of ethylene glycol dimethacrylate. The resulting mixture was reacted at 120° C. for 8 hours to thereby obtain an epoxy acrylate. 29 Parts of this epoxy acrylate (containing said ethylene glycol dimethacrylate), 10 parts of the polyester urethane acrylate obtained in Example 2, 26 parts of ethylene glycol dimethacrylate, 25 parts of trimethylolpropane triacrylate, 10 parts of neopentyl glycol diacrylate, 6.5 parts of benzoin isobutyl ether, 20 parts of talc, 2 parts of colloidal silica, 0.2 part of Phthalocyanine Green and 0.2 part of silicone oil were mixed to obtain an ink composition.

The resulting ink composition was tested in accordance with the same procedure as Example 1. It was observed from the test results that the coated film was about 30 μm thick, it was cured solidly to have a pencil hardness of 3H, and no separation of film took place thereon after having undergone the tape test. When subjected to the solder heat resisting test, it was observed that the coated film well followed the fluidity of the melted solder, thereby forming an excellent permanent protective film as seen in Example 1. The coated film, after having been left standing, displayed a high electric insulating resistance of $1.0 \times 10^{12} \Omega$.

What is claimed is:

1. A photopolymerizable ink composition mainly composed of a vehicle containing as essential ingredients
    A. a diacrylate of an epoxy resin made of bisphenol A and epichlorohydrin, which has an average molecular weight of from about 1,000 to about 4,000;
    B. a photosensitive resin having an average molecular weight of from about 1,000 to about 10,000, which has two or more acryloyl groups at the terminal through urethane bonds;
    C. a urethane bond-free bifunctional photopolymerizable methacrylate monomer or oligomer;
    D. a urethane bond-free polyfunctional photopolymerizable acrylate monomer or oligomer; and
    E. a photo-initiator;
wherein the weight ratios between ingredients A, B, C, D and E are in the following ranges:
    A:B = 9:5–10:90
    C:D = 95:5–10:90
    (A+B):(C+D) = 15:85–70:30, E being present in a ratio of from 0.3 to 8% by weight based on the entire ink composition.

2. The composition of claim 1 wherein the photosensitive resin is a reaction product between (a) a prepolymer selected from a polyester polyol having an average molecular weight of about 500 or more and an acid number of 20 or less, a polyether polyol having an average molecular weight of about 1,000 or more, a polybutadiene having an average molecular weight of about 1,000 or more and hydroxyl groups at the terminal and a polybutadiene acrylonitrile having an average molecular weight of about 1,000 or more and hydroxyl groups at the terminal; (b) an organic diisocyanate selected from tolylenediisocyanate, xylylenediisocyanate, 4,4'-diphenylmethanediisocyanate, isophoronediisocyanate and hexamethylenediisocyanate; and (c) a hydroxyl group-containing lower alkyl acrylate selected from 2-hydroxyethylacrylate and 2-hydroxypropylacrylate.

3. The composition of claim 1 or claim 2 wherein the photopolymerizable methacrylate monomer or oligomer includes ethylene glycol dimethacrylate, diethylene glycol dimethacrylate, triethylene glycol dimethacrylate, tetraethylene glycol dimethacrylate, polyethylene glycol #200 dimethacrylate, propylene glycol dimethacrylate, dipropylene glycol dimethacrylate, 1,3-butylene glycol dimethacrylate, 1,6-hexane glycol dimethacrylate, neopentyl glycol dimethacrylate, polyester oligomer dimethacrylate having a viscosity of 400 cps or less at 25° C. and an acid number of 30 or less and mixtures thereof.

4. The composition of claim 3 wherein the photopolymerizable acrylate monomer or oligomer includes ethylene glycol diacrylate, diethylene glycol diacrylate, triethylene glycol diacrylate, tetraethylene glycol diacrylate, polyethylene glycol #200 diacrylate, polyethylene glycol #400 diacrylate, polyethylene glycol #600 diacrylate, 1,3-butylene glycol diacrylate, 1,6-hexane glycol diacrylate, propylene glycol diacrylate, dipropylene glycol diacrylate, neopentyl glycol diacrylate, trimethylolpropane triacrylate, pentaerythritol triacrylate, pentaerythritol tetraacrylate, polyester oligomer polyacrylate having a viscosity of 400 cps or less at 25° C. and an acid number of 30 or less and mixtures thereof.

5. The composition of claim 4 wherein the photoinitiator includes benzoin, benzoin methyl ether, benzoin ethyl ether, benzoin isobutyl ether, benzoin isopropyl ether, 2-methyl anthraquinone, 2-t-butyl anthraquinone, 2-ethyl anthraquinone, Michler's ketone, thioxanthone, benzyl, benzophenone, acetophenone, α-diethoxyacetophenone, 2,2-dimethoxy-2-phenyl-acetophenone and mixtures thereof.

6. The composition of claim 1 further including a colored pigment, an inorganic filler, an antifoaming agent and a thermopolymerization inhibitor respectively in an effective quantity.

7. A photopolymerizable ink composition, whose film-forming ingredients consist essentially of:
    A. epoxy acrylate resin having the formula

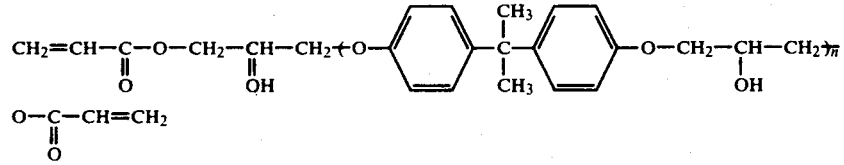

wherein n has a value such that the average molecular weight of said epoxy acrylate resin is from about 1,000 to about 4,000, B. urethane modified acrylate resin having two or more acryloyl groups at the terminals connected to urethane bonds and having an average molecular weight of from about 1,000 to about 10,000, said urethane modified acrylate resin being the reaction product of urethane-forming polyol prepolymer, organic diisocyanate and hydroxyl-containing lower alkyl acrylate, C. urethane bond-free, bifunctional, photopolymerizable methacrylate monomer or oligomer, D. urethane bond-free, polyfunctional, photopolymerizable acrylate monomer or oligomer, and E. a photo-initiator effective for initiating photopolymerization of A, B, C and D to form a polymerized film, the weight ratio of A:B being in the range of 95:5 to 10:90, the weight ratio of C:D being in the range of 95:5 to 10:90, the weight ratio of (A+B):(C+D) being in the range of 15:85 to 70:30, said composition containing from 0.3 to 8% by weight of E, based on the total weight of said composition.

* * * * *

UNITED STATES PATENT AND TRADEMARK OFFICE
CERTIFICATE OF CORRECTION

PATENT NO. : 4 271 258
DATED : June 2, 1981
INVENTOR(S) : Kiyosumi Watariguchi

It is certified that error appears in the above—identified patent and that said Letters Patent is hereby corrected as shown below:

Column 9, line 51; change "A:B=9:5-10:90"
to ---A:B=95:5-10:90---.

Signed and Sealed this

Twenty-fifth Day of August 1981

[SEAL]

Attest:

GERALD J. MOSSINGHOFF

Attesting Officer    Commissioner of Patents and Trademarks